United States Patent [19]
Parker

[11] 4,181,863
[45] Jan. 1, 1980

[54] PHOTODIODE CIRCUIT ARRANGEMENTS

[75] Inventor: John C. Parker, Edinburgh, Scotland

[73] Assignee: Ferranti Limited, Hollinwood, England

[21] Appl. No.: 945,852

[22] Filed: Sep. 26, 1978

Related U.S. Application Data

[63] Continuation of Ser. No. 783,688, Apr. 1, 1977, abandoned.

[30] Foreign Application Priority Data

Apr. 3, 1976 [GB] United Kingdom ............... 13620/76

[51] Int. Cl.² ........................................... H03K 17/00
[52] U.S. Cl. ................................. 307/311; 250/552; 307/310; 307/318
[58] Field of Search ............... 307/311, 310, 318; 250/211 J, 552

[56] References Cited

U.S. PATENT DOCUMENTS

| | | | |
|---|---|---|---|
| 3,665,442 | 5/1972 | Brooks | 307/311 |
| 3,705,316 | 12/1972 | Burrows et al. | 307/310 |
| 3,781,693 | 12/1973 | Nord | 307/310 |
| 3,795,821 | 3/1974 | Ichiyanagi | 307/311 |
| 3,925,709 | 12/1975 | Mitchell et al. | 307/311 |
| 4,079,272 | 3/1978 | Howatt | 307/311 |

FOREIGN PATENT DOCUMENTS 950080  11/1974  Canada.

Primary Examiner—Stanley D. Miller, Jr.
Assistant Examiner—B. P. Davis
Attorney, Agent, or Firm—Cameron, Kerkam, Sutton, Stowell & Stowell

[57] ABSTRACT

Temperature regulation of an avalanche photodiode is obtained by internal heating, by passing a reverse current through the breakdown region of the photodiode. In operation, an empirically-derived, reverse bias potential, equal to the breakdown potential at the desired operating temperature, is applied; and when incident radiation is to be detected the reverse bias potential is temporarily lowered to an empirically-derived operating value.

14 Claims, 6 Drawing Figures

PHOTODIODE CIRCUIT ARRANGEMENTS

This is a continuation, of application Ser. No. 783,688, filed Apr. 1, 1977, now abandoned.

BACKGROUND OF THE INVENTION

1. Field of the Invention

This invention relates to photodiode circuit arrangements, and in particular to such circuit arrangements each including a photodiode having within a semiconductor body a radiation sensitive P-N junction, and having a significant avalanche gain value.

2. Description of the Prior Art

It is conventional for the radiation sensitive P-N junction of the avalanche photodiode to be reverse biased when detecting incident radiation.

The responsivity of the photodiode is the magnitude of the current output for a unit of incident radiation flux.

The number of free electrons released within the semiconductor body for a quantum of incident energy is called the quantum efficiency of the photodiode.

Further, in an avalanche photodiode the reverse bias voltage applied across the photodiode causes the released electrons to accelerate in an active region associated with the P-N junction, causing further free electrons to be released within the semiconductor body by collision processes. The number of electrons produced in this way for each photo-electron is called the avalanche gain.

The responsivity of the avalanche photodiode at a given wavelength is proportional to the product of the quantum efficiency and the avalanche gain of the device.

Because the avalanche gain of the photodiode increases with the reverse bias potential across the photodiode so does the responsivity. In a conventional circuit arrangement the reverse bias voltage to be applied across the photodiode is determined by voltage limiting means. The voltage limiting means may comprise at least one Zener diode connected in parallel with the photodiode and its load, and if a plurality of Zener diodes are provided these are connected in series with each other.

However, there is an optimum value for the avalanche gain of the photodiode at a given magnitude for the current flow through the photodiode, and at a given noise level for an associated amplifier of the circuit arrangement, because inevitably the noise gain factor associated with the photodiode increases more rapidly with the avalanche gain value than the signal gain factor of the detector. At the optimum value for the avalanche gain the ratio of the responsivity of the photodiode to the total equivalent noise current at the amplifier input terminal is a maximum. When all the other parameters associated with the photodiode circuit arrangement are constant, the value for this ratio increases with the quantum efficiency of the photodiode, and so a photodiode with a high quantum efficiency is required.

Further, the quantum efficiency, which also rises with temperature, inevitably is not at a constant value throughout all normally encountered operating conditions for the photodiode. During the operation of the photodiode, inadvertent ambient temperature fluctuations can occur causing both the actual and the optimum responsivity of the device to change in an unpredictable way. Thus, the responsivity of the photodiode, even if it were to be constant, has an optimum value only at one temperature; and the overall signal-to-noise ratio at the amplifier associated with the photodiode is dependent upon the temperature.

It is possible to ensure that the responsivity of the device has a desired predetermined optimum value by adjusting the reverse bias voltage applied across the photodiode to compensate for any inadvertent fluctuations in the operating temperature. This arrangement is disadvantageous because it is required to control the reverse bias voltage over a large range of values, and because it is required to provide means to measure accurately the operating temperature of the device, for example, by providing a temperature sensor adjacent to the photodiode.

It is known to stabilise the operating temperature of the photodiode by supplying heat to the photodiode, so as to maintain its temperature at a desired value at or above the maximum normally-encountered ambient temperature. When at this desired temperature, a required reverse bias voltage is applied across the photodiode in order that the device has a predetermined optimum responsivity value. Usually, the stabilised operating temperature of the photodiode will be high, for example, 100° C. above the lower limit of the ambient temperature. Further, if the photodiode is required to operate shortly after switch-on, the rate of heat supplied to the exterior of the photodiode has to be high, for example, at a rate of more than 10 watts. The stabilisation of the temperature of the photodiode in this manner is facilitated by providing an enclosure for the photodiode. There is also provided externally of the enclosure heating means for the photodiode, arranged to supply a constant amount of heat. However, this indirect way of stabilising the operating temperature of the photodiode has the disadvantage that there is a significant delay before the operating temperature of the photodiode is obtained. Further, in order to measure the stabilised operating temperature some form of temperature sensor is required to be mounted adjacent to the photodiode, in the manner referred to above.

SUMMARY OF THE INVENTION

It is an object of the present invention to provide a novel and advantageous avalanche photodiode circuit arrangement, the circuit arrangement having fast actuating means for heating the photodiode in a direct way, and to obtain a desired stabilised operating temperature.

According to the present invention an avalanche photodiode circuit arrangement has an avalanche photodiode with a P-N junction within a semiconductor body and sensitive to incident radiation to which the avalanche photodiode is responsive, the material of the semiconductor body having a positive temperature coefficient of breakdown voltage. In the operation of the circuit arrangement the photodiode is to be energised by being connected to an electrical supply and the radiation sensitive P-N junction is to be reverse biased, the reverse bias voltage to be determined by voltage limiting means included in the circuit arrangement. The circuit arrangement is such that the reverse bias voltage to be applied across the photodiode selectively can be changed between two values, a higher value equal to an empirically-derived breakdown voltage of the photodiode at a desired operating temperature of the photodiode, and a lower value comprising an empirically-derived required reverse bias voltage at the desired operating temperature when the photodiode is to detect incident radiation. The temperature of the photodiode is to be stabilised at the desired operating value with the breakdown voltage at this temperature applied across the photodiode, and when detection of radiation incident on the photodiode is to take place the reverse bias voltage is to be reduced to said lower required value, the detection of the incident radiation to take place with the temperature, at least, in the active region associated with the radiation sensitive P-N junction of the photodiode, substantially at the desired operating value.

When the breakdown voltage at the desired operating temperature is applied initially across the photodiode, there is an appreciable reverse current flow in the breakdown region of the photodiode. The heat generated thereby within the semiconductor body of the photodiode causes the temperature of the photodiode to rise rapidly to the desired operating value, above which temperature breakdown within the semiconductor body ceases. Because the breakdown voltage temperature coefficient of any usually employed semiconductor material is positive, the temperature of the photodiode becomes stabilised at the value at which breakdown within the semiconductor body almost ceases. Thus, it is possible to derive empirically the breakdown voltage at a desired temperature; and it is possible to obtain a desired temperature for the photodiode in this way.

For convenience, in this specification the temperature at which the avalanche photodiode is stabilised when the empirically-derived breakdown voltage is applied across the photodiode will be referred to as the desired operating temperature, and the detection of incident radiation is required to take place with the temperature of, at least, the active region associated with the radiation sensitive P-N junction of the photodiode substantially at this value.

As indicated previously in this specification a photodiode having a required high quantum efficiency value is chosen; and the lower reverse bias voltage when incident radiation is to be detected, is chosen so that the photodiode has a predetermined optimum responsivity value at the desired stabilised operating temperature.

Hence, the higher and lower values of the reverse bias voltages to be applied across the photodiode can be determined empirically.

BRIEF DESCRIPTION OF THE DRAWINGS

The present invention will now be described by way of example with reference to the accompanying drawings, in which.

DESCRIPTION OF THE PREFERRED EMBODIMENTS

Figure 1:
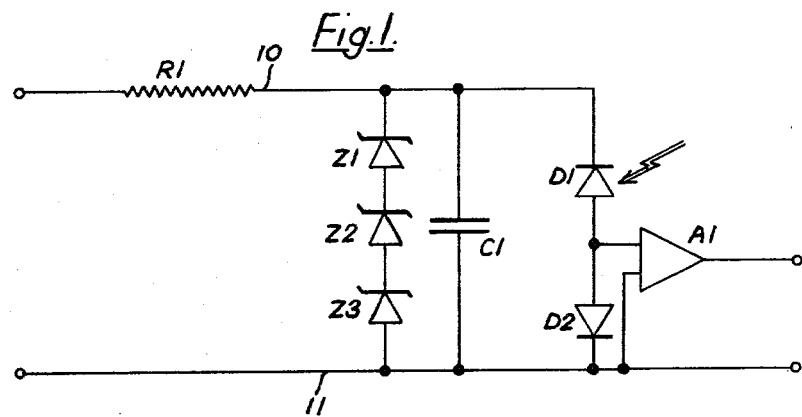
FIG. 1 is a circuit diagram of a known avalanche photodiode circuit arrangement.

The known photodiode circuit arrangement shown in FIG. 1 has an avalanche photodiode D1 having within a silicon semiconductor body (not shown) a radiation sensitive P-N junction. The avalanche photodiode D1 is mounted so that radiation to which the device is responsive can be incident on the photodiode, and the photodiode is capable of detecting the incident radiation.

The avalanche photodiode D1 is to be reverse biased, and its cathode is connected to a rail 10 connected via a high resistor R1 to a positive DC electrical supply (not shown) of a high voltage. The anode of the photodiode is connected indirectly to a rail 11 to be maintained at substantially zero potential. The current output of the photodiode is obtained via an operational amplifier A1, the low input impedance of which amplifier completes the path between the anode and the rail 11. A shunt diode D2 is provided between the input terminal of the amplifier and the rail 11, and the diode D2 becomes forward biassed when the current flow into the amplifier increases to a value greater than that normally encountered.

The reverse bias voltage applied across the photodiode D1 is less than the voltage provided by the electrical supply, and is predetermined by voltage limiting means connected in parallel with the photodiode. In the illustrated circuit arrangement the voltage limiting means comprises a parallel combination of a large capacitor C1 and a chain of three Zener diodes Z1, Z2, Z3 connected in series with each other, the parallel combination being connected between the rails 10 and 11. The capacitor C1 reduces undesirable noise within the Zener diodes.

In the operation of the illustrated circuit arrangement the photodiode D1 draws only a negligible current from the rail 10. Even when the photodiode is detecting a significant intensity of pulsed incident radiation to which it is responsive, and provides a significant current output, it draws this low current from the capacitor C1.

The photodiode D1 is arranged within an enclosure (not shown), and is mounted on a substrate having electrical insulating properties. An electrical heating element (not shown) is placed adjacent to the enclosure, and provides for the photodiode enough heat at a constant rate to maintain the operating temperature at a chosen value, higher than the maximum ambient temperature, during normally encountered operating conditions. The heat source is controlled to supply heat at a particular constant rate in response to the output of a temperature sensing device (not shown) so that the operating temperature of the photodiode is stabilised at a value determined by the electrical heating element.

The photodiode is selected to have a high quantum efficiency value, for example 30% at a wavelength of $1060 \times 10^{-9}$ meters, and at a temperature of $+60°$ C. At the desired operating temperature, and with the predetermined reverse bias voltage applied across the photodiode, the photodiode has a predetermined optimum responsivity value.

It is necessary to ensure that the reverse bias voltage is less than the breakdown voltage of the photodiode at the desired operating temperature.

The disadvantage of such an arrangement is that it is slow to reach the desired operating temperature after the electrical heating element has been energised, for example, a period of 2 minutes being required.

Figure 2:
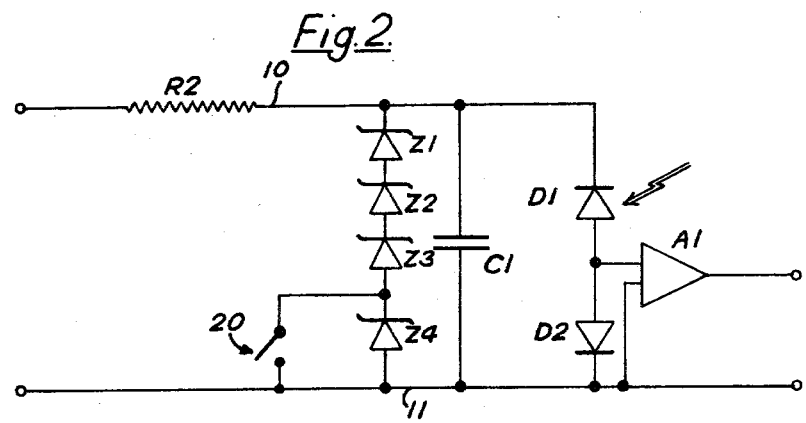
FIG. 2 is a circuit diagram of one embodiment of an avalanche photodiode circuit arrangement according to the present invention.

A photodiode circuit arrangement according to the present invention is shown in FIG. 2. Parts of the circuit arrangement of FIG. 2 identical to, or closely resembling, parts of the circuit arrangement of FIG. 1 have the same reference numerals as in FIG. 1.

The circuit arrangement of FIG. 2 differs from the known photodiode circuit arrangement shown in FIG. 1 in that the voltage of the D.C. electrical supply is higher. Further, an appreciable reverse current must be provided by the electrical supply to the photodiode D1, and so a resistor R2 is in series with the rail 10 and has a lower value than that of the resistor R1 of FIG. 1.

In addition, the voltage limiting means includes voltage switching means comprising a switch 20 connected across a part of the voltage limiting means. When the switch 20 is closed the part of the voltage limiting means is bypassed. The photodiode circuit arrangement according to the present invention is arranged such that a higher reverse bias voltage can be applied across the photodiode, the higher reverse bias voltage being determined by four Zener diodes Z1, Z2, Z3 and Z4, and equal to the breakdown voltage of the photodiode at the desired operating temperature of the photodiode. This is the same operating temperature as that for the known circuit arrangement of FIG. 1. A lower reverse bias voltage, determined by bypassing the Zener diode Z4 of the voltage limiting means, is applied across the photodiode when it is required to detect incident radiation to which the photodiode is responsive.

The desired operating temperature of the photodiode is determined by the higher reverse bias voltage, and irrespective of whether or not radiation to which the device is responsive is incident on the photodiode. Further, the higher reverse bias voltage is chosen so that the photodiode has an operating temperature to ensure that the responsivity of the photodiode has the predetermined optimum value with a conveniently provided lower reverse bias voltage applied across the photodiode.

This desired operating temperature is obtained in a direct way by generating heat within the semiconductor body of the photodiode. When the higher reverse bias voltage is applied initially across the photodiode an appreciable reverse current is drawn from the rail 10 and flows in the breakdown region of the photodiode. The heat generated thereby within the semiconductor body of the photodiode causes the temperature of the photodiode to rise rapidly. At the desired operating value for the temperature of the photodiode breakdown within the semiconductor body drops almost to zero. Because the breakdown voltage temperature coefficient of the silicon semiconductor material is positive the temperature of the photodiode becomes stabilised at the value at which breakdown within the semiconductor body almost ceases. Thus, it is possible to derive empirically the breakdown voltage at the desired operating temperature; and it is possible to obtain a desired stabilised operating temperature for the photodiode in this way.

In order to maintain the desired stabilised operating temperature after it has been obtained a small reverse current continues to flow through the photodiode, the heat generated thereby being just sufficient to maintain the required temperature differential across the substrate of the enclosure. If the heating current is excessive the shunt diode D2 becomes forward biassed, and the current flows therethrough to the rail 11.

For the circuit arrangement illustrated in either FIG. 1 or FIG. 2, having the same operating temperature, the same required reverse bias voltage is to be applied across the photodiode when incident radiation is to be detected. This is the lower reverse bias voltage to be applied across the photodiode of the circuit arrangement shown in FIG. 2, and is applied only for as long as it is necessary to detect the incident radiation.

For convenience, the Zener diode Z4 is included in the illustrated circuit arrangement to indicate that the same reverse bias voltage is to be applied across the photodiode of the circuit arrangements of FIGS. 1 and 2 when incident radiation is to be detected. However, it will be understood that several alternative constructions are possible.

In the circuit arrangement shown in FIG. 2 the part Z4, required to define the difference between the required higher and lower values of the reverse bias voltage to be applied across the photodiode, is empirically determined because the higher and lower reverse bias voltages to be applied across the photodiode are empirically determined in the manner referred to above. This difference in the two reverse bias voltages is small enough for it easily to be obtained by actuating a switch 20.

In operation of the photodiode circuit arrangement of FIG. 2 the higher reverse bias voltage, determined by the four Zener diodes Z1, Z2, Z3 and Z4, initially is applied across the photodiode until the temperature of the photodiode is stabilised at the desired operating value. When subsequently, the photodiode is required to detect incident radiation the switch 20 is closed, the lower reverse bias voltage, determined by the three Zener diodes Z1, Z2, Z3 is applied across the photodiode. Then, whilst the temperature, at least, in the active region associated with the radiation sensitive P-N junction of the photodiode is substantially at the desired operating value the output current of the circuit arrangement is measured. This output current represents the intensity of the incident radiation to which the photodiode is responsive. Subsequently, the switch contacts are re-opened, the higher reverse bias voltage is re-established across the photodiode, and the desired operating temperature is obtained again, ready for another detection of the incident radiation to take place.

When the photodiode is detecting a significant intensity of incident radiation to which it is responsive, and provides a significant current output, drawn from the rail 10, the diode D2 is completed through the amplifier A1.

The direct way of heating the photodiode to obtain the desired operating temperature, and described above with reference to FIG. 2, is faster than with the indirect way of heating the photodiode described above with reference to FIG. 1, for example, a time of less than 100 milliseconds for a 100° C. temperature rise being possible.

The period during which a detection of the incident radiation is required to take place may be less than 100 microseconds. Hence, it is possible to ensure that the temperature, at least, in the active region associated with the radiation sensitive P-N junction of the photodiode is at the desired operating value during this short period.

The switch 20 may have any convenient construction, and may comprise either a thyristor or a high voltage transistor.

Figure 3:
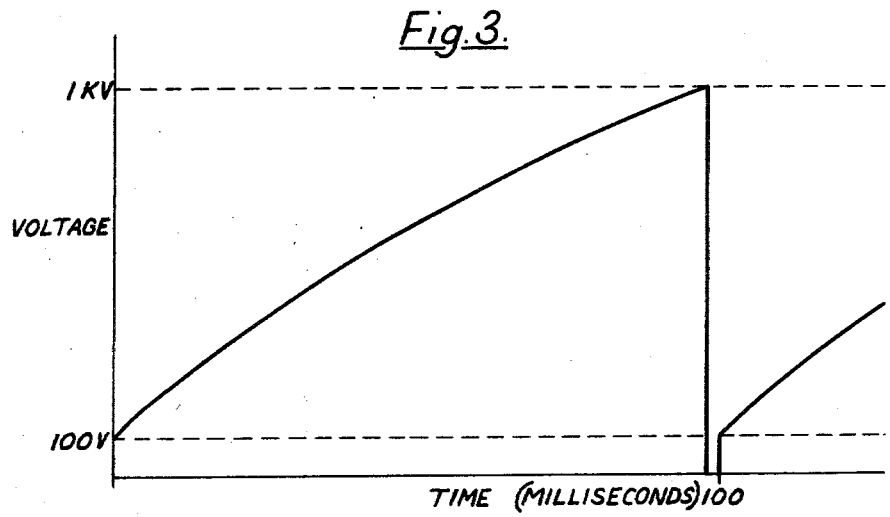
FIG. 3 shows the waveform of a variable voltage to be applied across the whole of the voltage reducing means and a series resistance of an alternative embodiment of a photodiode circuit arrangement.

In one particular application a photodiode circuit arrangement according to the present invention is employed to detect radiation emitted by a laser. If it is a Q-switched laser a voltage having the generally sawtooth waveform shown in FIG. 3 is available. The increasing part of the waveform is caused by the gradual charging up of a pulse forming network from a current source, and the falling part of the waveform is caused by the sudden discharge of the pulse forming network by a laser flash tube.

It is required to detect incident radiation on the photodiode in the short period after the electrical supply voltage becomes substantially zero, in which period the operating temperature of the photodiode will not fall significantly; and it is required that the photodiode obtains the desired stabilised operating temperature in the long period whilst the electrical supply voltage is rising to its maximum value.

Figure 4:
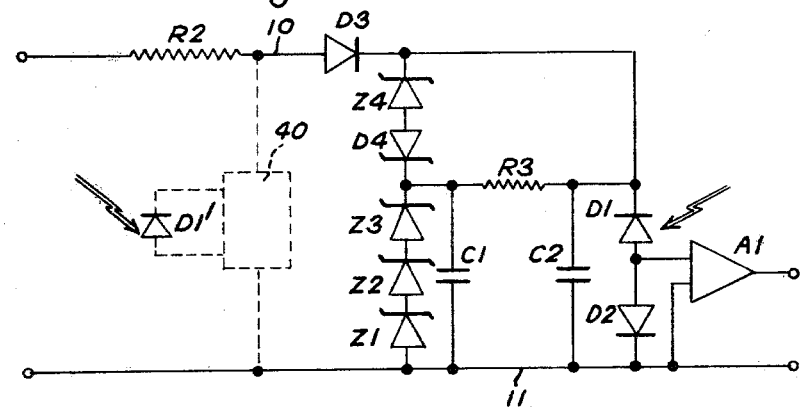
FIG. 4 is a circuit diagram of this alternative embodiment according to the present invention.

The photodiode circuit arrangement shown in FIG. 4 is capable of operating in such a manner. A voltage having the waveform of FIG. 3, is applied across the whole of the voltage limiting means and the resistor R2, i.e., parts of the photodiode circuit arrangement of FIG. 4 identical with, or closely resembling, parts of the circuit arrangement of FIG. 2 have the same reference numerals as in FIG. 2.

The photodiode circuit arrangement shown in FIG. 4 has a peak rectifier circuit providing charging current for the large capacitor C1. This peak rectifier circuit comprises the large capacitor C1, a diode D3, and the Zener diode Z4, which is arranged back-to-back with a diode D4. Further, the order of the Zener diode chain Z1, Z2, Z3 and Z4 is reversed in this embodiment, and the diode D4 is connected between the Zener diodes Z4 and Z3. The large capacitor C1 is connected in parallel with only the part Z1, Z2 and Z3 of the Zener diode chain. The diode D4 is to prevent the photodiode D1, when detecting incident radiation, from drawing current from the capacitor C1 through the low forward impedance of the Zener diode Z4.

There is also provided a small capacitor C2 connected in parallel with the large capacitor C1, the two capacitors C1 and C2 being connected together via a resistor R3. The small capacitor C2 and the resistor R3 prevent the photodiode D1 from drawing an excessive charge from the large capacitor C1, and over heating, if the intensity of the incident radiation to which the photodiode is responsive is large during the short period when photodiode D1 is detecting incident radiation, and the bias voltage applied across the photodiode has its lower predetermined value.

When the voltage of the electrical supply has risen sufficiently from zero, current starts to flow through the Zener diode Z4 and the diode D4 to charge the large capacitor C1. The capacitor C1 charges up to the voltage set by the part Z1, Z2 and Z3 of the Zener diode chain i.e., the lower reverse bias voltage to be applied across the photodiode. The reverse bias voltage applied across the small capacitor C2, and the photodiode D1, however, rises to the value determined by the whole of the Zener diode chain Z1, Z2, Z3 and Z4, i.e., the higher reverse bias voltage to be applied across the photodiode, and the temperature of the photodiode becomes stabilised at the desired operating value.

When the voltage of the electrical supply is switched to zero the large capacitor C1 remains charged at the lower reverse bias voltage for the short period during which the photodiode is to detect incident radiation, and this lower reverse bias voltage is applied across the photodiode. The small capacitor C2 rapidly discharges, initially through the Zener diode Z4 and the diode D4, into the large capacitor C1, and subsequently directly into the large capacitor C1 via the resistor R3.

Thus, in this illustrated photodiode circuit arrangement the reverse bias voltage to be applied across the photodiode is changed selectively between the empirically-derived higher and lower values by the voltage applied across the whole of the voltage limiting means, and the resistor R2, being changed, selectively, from a high to a low magnitude.

In an unillustrated variation of the circuit arrangement of FIG. 4 the diode D4 is connected between the point between the Zener diodes Z3 and Z4 and the point between the capacitor C1 and the resistor R3.

The higher and lower reverse bias voltages for the photodiode, instead of being determined directly by employing Zener diodes, may be derived by other forms of voltage limiting means, such as low-impedance or regulated power supplies.

Figure 5:
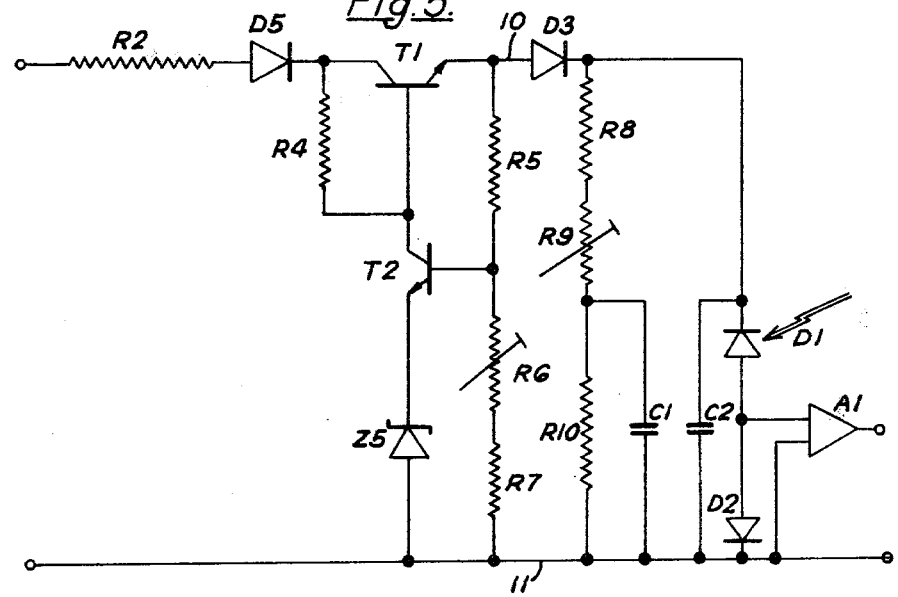
FIG. 5 is a circuit diagram of another embodiment according to the present invention.

Thus, in another way of deriving the two reverse bias voltages for the photodiode, and as shown in FIG. 5, a voltage regulator is employed as the voltage limiting means.

Parts of the embodiment of FIG. 5 identical to, or closely resembling, parts of the embodiment of FIG. 4, are indicated by the same reference numerals in both Figures.

An input voltage, of any convenient varying waveform, such as that of FIG. 3, and supplied to the line 10 via the resistor R2 and a diode D5, is regulated by a part of the circuit arrangement comprising an NPN transistor T1 connected in series with the line 10, the base of the transistor T1 being connected both, via a resistor R4 to a point between the diode D5 and the collector of the transistor, and to the collector of another NPN transistor T2. The emitter of the transistor T2 is connected via a Zener diode Z5 to the line 11, and the base of the transistor T2 is connected to a potential dividing arrangement, comprising a chain of resistors R5, R6 and R7 connected between the lines 10 and 11. The base of the transistor T2 is connected to a point between the resistors R5 and R6, and the resistor R6 comprises a variable resistor. A regulated voltage is obtained on the line 10 at all times when the input voltage is above a predetermined threshold value, and the regulated voltage comprises the higher reverse bias voltage to be applied across the photodiode D1. The higher reverse bias voltage is regulated with reference to the Zener diode Z5, and its value is determined by the setting of the variable resistor R5. The diode D5 is required to protect the high voltage transistor T1 from high voltage negative-going transients at the input.

The lower reverse bias voltage to be applied across the photodiode D1 is obtained by providing a further potential dividing chain of resistors R8, R9 and R10 between the lines 10 and 11, the resistor R9 comprising a variable resistor. The lower reverse bias voltage appears across, and charges up, the capacitor C1, which is connected between a point between the resistors R9 and R10, and the line 11. The values of R8, R9 and C1 are such that the capacitor C1 is fully charged in less than one cycle of the input supply voltage waveform. The setting of the variable resistor R9 determines the magnitude of the lower reverse bias voltage.

The diode D3 is provided in the line 10, between the resistors R5 and R8 of the two resistor chains. The smaller capacitor C2 is connected in parallel with the photodiode D1–diode D2 combination.

The higher reverse bias voltage is applied across the photodiode D1 whenever the input voltage is above the predetermined threshold value, and diode D3 conducts. When the input voltage is below the predetermined threshold value the diode D3 becomes reverse biased isolating the photodiode D1 from the line 10. The smaller capacitor C2 rapidly discharges through the resistors R8 and R9 into the capacitor C1, enabling the lower reverse bias voltage, across the capacitor C1, to be applied across the photodiode D1 for the short period during which the photodiode is to detect incident radiation.

The electrical supply of the photodiode circuit arrangement according to the present invention is required to be able to supply an appreciable reverse current to obtain the desired stabilised operating temperature for the photodiode D1. This requirement implies that the current output of the photodiode circuit arrangement, either when detecting incident radiation or not, may be sufficiently large to damage the photodiode by overheating if the incident radiation is of an intensity greater than normally-encountered magnitudes.

Figure 6:
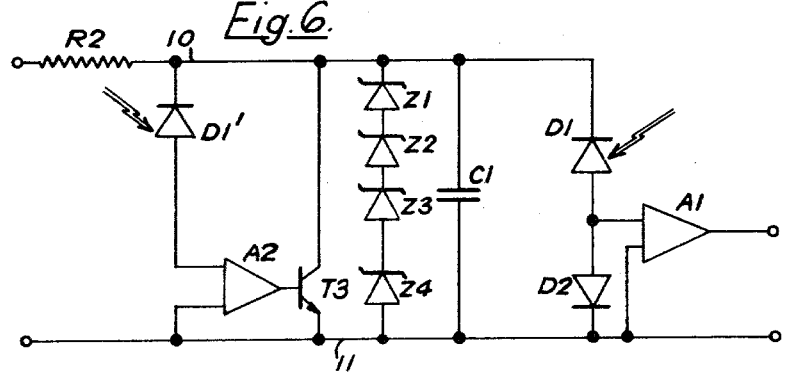
FIG. 6 is a circuit diagram of a modification of that shown in FIG. 2, there being included in the circuit arrangement an auxiliary photodiode arranged to protect the circuit arrangement from the effects of an excessive amount of radiation incident upon the main photodiode.

If the photodiode is to be subjected to excessive incident radiation for long periods, and when the photodiode is required to detect the incident radiation or not, the consequent large and prolonged current output for the photodiode circuit arrangement can be prevented by modifying the circuit arrangement of FIG. 2 in the manner shown in FIG. 6. Parts of the photodiode circuit arrangement of FIG. 6 identical with, or closely resembling, parts of the circuit arrangement of FIG. 2 have the same reference numerals as in FIG. 2.

The modification shown in FIG. 6 comprises providing means to reduce the higher reverse bias potential level of the rail 10 selectively when the photodiode is subjected to an excessive intensity of incident radiation. This means includes an auxiliary photodiode D1', which is of lower responsivity and/or with a slightly wider angle of view, than the photodiode D1. The auxiliary photodiode D1' is orientated in substantially the same direction as the photodiode D1.

In the illustrated arrangement the auxiliary photodiode D1' is connected to a switch, the switch comprising a high voltage transistor T3. The auxiliary photodiode D1' is shown connected in series with an amplifier A2, and is between the rail 10 and the base of the transistor T3, although conveniently it may be connected in different ways. The collector of the transistor T3 is connected to the rail 10, and the emitter is connected to the rail 11 to be maintained at substantially zero potential.

When the auxiliary photodiode D1' detects that the intensity of the incident radiation on both itself and the photodiode D1 has reached a threshold value for a long period then the current output of the auxiliary photodiode D1' causes the transistor T3 to be conducting, and the Zener diodes Z1 to Z4 by bypassed. The threshold value, determined by the manner of operation of the auxiliary photodiode D1', is arranged to be such that the photodiode D1 will not produce a sustained response sufficiently large to damage itself. The auxiliary photodiode D1' is not of the avalanche type, and its responsivity is not strongly dependent upon either its reverse bias voltage or its operating temperature. Such a photodiode D1' can be biassed from a low voltage source, and may be connected to a point between the Zener diodes Z1 and Z2 of the switching means, instead of being connected to the rail 10.

In operation, when the auxiliary photodiode D1' detects a prolonged and excessive incident radiation the bias voltage of the photodiode D1 is reduced to a predetermined level, this level when multiplied by the current the resistor R2 is capable of passing, gives a product in watts which will not significantly raise the temperature of the photodiode D1, or the diode D2.

Alternatively, the auxiliary photodiode D1' may be arranged to reduce the reverse current capable of being supplied to the photodiode D1 from the electrical supply, when the auxiliary photodiode detects that the intensity of the incident radiation reaches the threshold value. Such an arrangement is shown in FIG. 4, the circuit arrangement of FIG. 4 having the auxiliary photodiode D1' arranged to control current by-pass means 40 in the appropriate manner, and whether the photodiode D1 is required to detect the incident radiation or not.

What I claim is:

1. An avalanche photodiode circuit arrangement comprising an avalanche photodiode having a P-N junction within a semiconductor body and being sensitive to incident radiation to which the avalanche photodiode is responsive, the material of the semiconductor body having a positive temperature coefficient of breakdown voltage, means for operatively connecting the photodiode to an electrical supply such that the radiation sensitive P-N junction is reverse biased, said means including voltage limiting means for determining the reverse bias voltage and further means for selectively changing the reverse bias voltage applied across the photodiode between a higher and a lower value, said higher value being equal to an empirically-derived breakdown voltage of the photodiode at a desired operating temperature of the photodiode, and said lower value comprising an empirically-derived required reverse bias voltage at the desired operating temperature when the photodiode is to detect incident radiation, the temperature of the photodiode being stabilized at the desired operating value with the breakdown voltage at this temperature applied across the photodiode, and detection of radiation incident on the photodiode taking place at the lower value of the reverse bias voltage, the detection of the incident radiation taking place with the temperature, at least in the active region associated with the radiation senstive P-N junction of the photodiode, being substantially at the desired operating value.

2. An avalanche photodiode circuit arrangement comprising an avalanche photodiode having a P-N junction within a semiconductor body and being sensitive to incident radiation to which the avalanche photodiode is responsive, the material of the semiconductor body having a positive temperature coefficient of breakdown voltage, means for operatively connecting the photodiode to a variable voltage electrical supply such that the radiation sensitive P-N junction is reverse biased by a reverse bias voltage across the photodiode which varies between a higher and a lower value, said higher value being equal to an empirically-derived breakdown voltage of the photodiode at a desired operating temperature of the photodiode, and said lower value comprising an empirically-derived required reverse bias voltage at the desired operating temperature when the photodiode is to detect incident radiation, the temperature of the photodiode being stabilized at the desired operating value with the breakdown voltage at this temperature applied across the photodiode, and detection of radiation incident on the photodiode taking place at the lower value of the reverse bias voltage, the detection of the incident radiation taking place with the temperature, at least in the active region associated with the radiation sensitive P-N junction of the photodiode, being substantially at the desired operating value, said means including voltage limiting means for determining the reverse bias voltage, said variable voltage supply being arranged to apply a variable voltage across the whole of the voltage limiting means, such that the reverse bias voltage applied across the photodiode changes between the empirically-derived higher and lower values.

3. An avalanche photodiode circuit arrangement as claimed in claims 1 or 2 wherein the variable voltage applied across the whole of the voltage limiting means comprises a voltage having a generally sawtooth waveform, and said means for selectively changing the reverse bias voltage including a pulse forming network and a current source, said pulse forming network being connected to the current source for providing said sawtooth waveform voltage.

4. An avalanche photodiode circuit arrangement as claimed in claims 1 or 2 in which the voltage limiting means comprises a chain of at least two Zener diodes connected in series with each other, the chain being partially connected in parallel with the photodiode, the part of the chain of Zener diodes connected in parallel with the photodiode determining the lower value of the reverse bias voltage, and the whole of the chain of Zener diodes determining the higher value of the reverse bias voltage, to be applied across the photodiode.

5. An avalanche photodiode circuit arrangement as claimed in claims 1 or 2 in which the voltage limiting means comprises a regulated voltage supply and potential dividing means connected across the regulated supply, the lower reverse bias voltage being determined by said dividing means and the higher reverse bias voltage to be applied across the photodiode is related to the output of the regulated supply.

6. An avalanche photodiode circuit arrangement as claimed in claims 1 or 2, including a first capacitor coupled to the photodiode and connected across at least a portion of the voltage limiting means, to be charged to the same voltage as that across said portion, and a second capacitor coupled to the photodiode, and to be charged to the same voltage as the higher reverse bias voltage to be applied across the photodiode, the circuit arrangement being such that both capacitors are capable of discharging to provide a current for the photodiode, the second capacitor partially discharging before the voltage on the first capacitor begins to be reduced.

7. An avalanche photodiode circuit arrangement as claimed in claim 1 including means for applying a constant voltage across the whole of the voltage limiting means, and the voltage limiting means comprises a chain of at least two Zener diodes connected in series with each other, the chain being at least partially connected in parallel with the photodiode, the circuit arrangement being such that the whole of the chain of Zener diodes determines the higher reverse bias voltage to be applied across the photodiode, a part of the chain of Zener diodes determines the lower reverse bias voltage, and voltage switching means connected to said chain such that the remainder of the chain of Zener diodes, other than said part, can be by-passed in response to the actuation of the switching means.

8. An avalanche photodiode circuit arrangement as claimed in claim 1 and including means to protect the photodiode from damage due to the flow therethrough of a current in response to there being radiation incident upon the photodiode of an intensity greater than normally-encountered magnitudes, and when such a current flows for a period long enough to cause the photodiode to overheat.

9. An avalanche photodiode circuit arrangement as claimed in claim 8 in which the means to protect the photodiode includes an auxiliary photodiode orientated in substantially the same direction as the main photodiode, and the circuit arrangement is such that in response to the auxiliary photodiode detecting incident radiation of an intensity greater than normally-encountered magnitudes the higher reverse bias voltage to be applied across the main photodiode is reduced.

10. An avalanche photodiode circuit arrangement as claimed in claim 9 in which the auxiliary photodiode has a lower responsivity than the main photodiode.

11. An avalanche photodiode circuit arrangement as claimed in claim 9 in which the auxiliary photodiode has a wider angle of view than the main photodiode.

12. An avalanche photodiode circuit arrangement as claimed in claim 8 in which the means to protect the photodiode includes an auxiliary photodiode orientated in substantially the same direction as the main photodiode, and the circuit arrangement is such that in response to the auxiliary photodiode detecting incident radiation of an intensity greater than normally-encountered magnitudes the current to be supplied to the main photodiode is reduced.

13. An avalanche photodiode circuit arrangement as claimed in claim 12 in which the auxiliary photodiode has a lower responsivity than the main photodiode.

14. An avalanche photodiode circuit arrangement as claimed in claim 12 in which the auxiliary photodiode has a wider angle of view than the main photodiode.

* * * * *